(12) United States Patent
Karlquist

(10) Patent No.: US 7,095,989 B2
(45) Date of Patent: Aug. 22, 2006

(54) FREQUENCY TRANSLATING DEVICES AND FREQUENCY TRANSLATING MEASUREMENT SYSTEMS WITH DC BIAS ADDED TO A MIXER DIODE

(75) Inventor: Richard K. Karlquist, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 1122 days.

(21) Appl. No.: 09/941,418

(22) Filed: Aug. 28, 2001

(65) Prior Publication Data
US 2003/0045261 A1    Mar. 6, 2003

(51) Int. Cl.
*H01Q 11/12* (2006.01)
*H03H 11/40* (2006.01)

(52) U.S. Cl. ............... 455/127.1; 455/130; 455/169.2; 455/180.4; 455/189.1; 455/193.3; 455/209; 455/257; 455/313; 455/318; 455/325; 455/326; 455/330; 455/343.1; 530/524; 530/530

(58) Field of Classification Search ................ None
See application file for complete search history.

(56) References Cited

U.S. PATENT DOCUMENTS

| | | | |
|---|---|---|---|
| 5,157,786 A * | 10/1992 | Muterspaugh | 455/326 |
| 5,337,014 A | 8/1994 | Najle et al. | 324/613 |
| 5,678,225 A | 10/1997 | Kobayashi | 455/330 |
| 5,920,245 A * | 7/1999 | Ishikawa et al. | 333/248 |
| 5,937,006 A | 8/1999 | Clark et al. | 375/224 |
| 6,041,077 A * | 3/2000 | Clark et al. | 375/224 |

* cited by examiner

*Primary Examiner*—Duc Nguyen
*Assistant Examiner*—Matthew Genack

(57) ABSTRACT

A frequency translating device (FTD) includes at least one mixer diode connected to down-convert a radio frequency (RF) to an intermediate frequency (IF) and to up-convert an IF to an RF and a source of direct current (DC) bias that is connected to the mixer diode. The source of DC bias provides DC bias to the mixer diode that moves the voltage applied to the mixer diode closer to the threshold voltage of the mixer diode. The mixer diode is turned on in response to the DC bias and a local oscillator (LO) drive. Because DC bias is applied to the mixer diode, the peak to peak voltage range of the LO drive can be reduced, thereby reducing the voltage-dependent capacitance of the mixer diode, causing the FTD to exhibit improved reciprocity. The FTD can be used in a three-pair measurement system to determine the conversion response of another FTD.

26 Claims, 8 Drawing Sheets

DSB Measurement Flow Diagram

FREQUENCY TRANSLATING DEVICES AND FREQUENCY TRANSLATING MEASUREMENT SYSTEMS WITH DC BIAS ADDED TO A MIXER DIODE

FIELD OF THE INVENTION

The invention relates to frequency translating devices (FTDs) and systems and methods for characterizing the conversion responses of FTDs.

BACKGROUND OF THE INVENTION

FTDs (e.g., mixers, converters, and tuners) are devices that convert radio frequencies (RF) to intermediate frequencies (IF) when used for down-conversion or IFs to RFs when used for up-conversion. In a three-port mixer, the down-conversion of an RF to an IF or the up-conversion of an IF to an RF involves mixing an input signal with a local oscillator (LO) signal. Mixing an input signal with an LO signal generates two primary output signals having frequencies that are the sum of the input signal frequency and the LO signal frequency and the difference between the input signal frequency and the LO signal frequency. In down-conversion, an RF signal is mixed with an LO signal to generate a lower frequency IF signal and in up-conversion an IF signal is mixed with an LO signal to generate a higher frequency RF signal.

As the demand for wireless communications services increases, more advanced FTDs with tighter operating tolerances are being developed. To support the development of new FTDs and the integration of FTDs into RF communications systems, the conversion responses of FTDs need to be characterized. Two conversion responses of FTDs that are typically characterized include conversion loss and phase shift. The conversion loss of an FTD is a measure of the difference in amplitude between the input signal (the RF in down-conversion and the IF in up-conversion) and the output signal (the IF in down-conversion and the RF in up-conversion). The phase shift of an FTD is a measure of the phase shift between the input signal and the output signal.

A technique for characterizing the conversion response of an FTD is disclosed in U.S. Pat. No. 5,937,006 issued to Clark et al. (hereinafter Clark). Clark discloses a measurement technique for characterizing an FTD that involves making at least three different measurements using three different pairs of FTDs, where the three different pairs of FTDs are put together from a set of three different FTDs. According to the three-pair measurement technique, one of the FTDs is the device under test (DUT) and the other two FTDs are test devices (referred to as test mixer 1, TM1, and test mixer 2, TM2) that support the characterization of the DUT. FIG. 1 depicts the basic structure of a three-pair measurement system 100 for characterizing the single side band conversion response of an FTD. The three-pair measurement system includes a vector network analyzer (VNA) 102, a controller 104, an up-conversion FTD 110, a down-conversion FTD 112, connections 106 and 108 between the VNA and the up-conversion and down-conversion FTDs, an optional phase shifter 114, an LO 116, and a splitter 118. Although FIG. 1 depicts the basic structure of a three-pair measurement system, an actual implementation may include additional components, such as filters, attenuators, and isolators, which are used to improve the measurement quality. Characterizing the single side band response of a DUT FTD using the three-pair measurement system involves three separate measurements with the DUT, TM1, and TM2 used in different combinations as the up-conversion FTD and the down-conversion FTD. The connections 106 and 108 couple the FTDs to the VNA and may include ports and connection cables as is known in the field.

FIG. 2 is a measurement flow diagram for characterizing the conversion response of a single side band DUT. The flow diagram indicates the different combinations of the DUT, TM1, and TM2 that are used to characterize the DUT. In measurement A (step 220), an IF is input into the up-conversion FTD (the DUT) for up-conversion to an RF and then into the down-conversion FTD (TM1) for down-conversion back to an IF. The result of measurement A is a measurement $M_A(f)$ that is used to determine a response $R_A(f)$. In measurement B (step 222), an IF is input into the up-conversion FTD (the DUT) for up-conversion to an RF and then into the down-conversion FTD (TM2) for down-conversion back to an IF. The result of measurement B is a measurement $M_B(f)$ that is used to determine a response $R_B(f)$. In measurement C (step 224), an IF is input into the up-conversion FTD (TM1) for up-conversion to an RF and then into the down-conversion FTD (TM2) for down-conversion back to an IF. The result of measurement C is a measurement $M_C(f)$ that is used to determine a response $R_C(f)$. The single side band response of the DUT is then calculated (step 226) as $R_{DUT}(f)=[R_A(f)+R_B(f)-R_C(f)]/2$.

One requirement of the three-pair measurement system is that one of the test FTDs (either TM1 or TM2) must have a reciprocal conversion response. That is, the conversion response of the reciprocal FTD must be the same whether the FTD is used as a down-conversion FTD 112 or as an up-conversion FTD 110. In the three-pair test system, the reciprocal FTD is the FTD that is used as the down-conversion FTD in one of the measurements and as the up-conversion FTD in another one of the measurements. Referring to the flow diagram of FIG. 2, TM1 is used as the down-conversion FTD in measurement A (step 220) and as the up-conversion FTD in measurement C (step 224). To accurately determine the conversion response of the DUT, TM1 must have a reciprocal conversion response.

Referring back to FIG. 1, the basic structure of a three-pair measurement system 100 for characterizing the double side band conversion response of a DUT is the same as the measurement system for characterizing a single side band response except that the measurement system includes the phase shifter 114. In the embodiment of FIG. 1, the phase shifter is located between the LO 116 and the down-conversion FTD 112 so that the phase of the LO can be shifted before it is inserted into the down-conversion FTD.

FIG. 3 is a measurement flow diagram for characterizing a double side band response of a DUT. The flow diagram indicates the different combinations of the DUT, TM1, TM2, and the phase of the LO that are used to characterize the DUT. The double side band characterization involves initial measurements A, B, and C (steps 320, 322, and 324) that are similar to the A, B, and C measurements (steps 220, 222, and 224) described above with reference to FIG. 2. The double side band characterization includes additional measurements A', B', and C' that are made with the same FTD configuration however the phase of the LO that is inserted into the down-conversion FTD is shifted by 90 degrees to obtain the A', B', and C' measurements. This technique enables calculation of the upper side band (USB) and the lower side band (LSB) conversion responses of the DUT. As shown in FIG. 3 at step 326, the USB conversion response of the DUT is calculated as $R_{DUT\ USB}(f)=[R_{A\ USB}(f)+R_{B\ USB}(f)-R_{C\ USB}$ (f)]/2 and the LSB conversion response of the DUT is calculated as $R_{DUT\ LSB}(f)=[R_{A\ LSB}(f)+R_{B\ LSB}(f)-R_{C\ LSB}(f)]/2$.

As with the single side band measurement technique, one of the test FTDs (either TM1 or TM2) must have a reciprocal conversion response. Referring to FIG. 3, TM1 is used as the down-conversion FTD in the A and A' measurements (step 320) and is used as the up-conversion FTD in the C and C' measurements (step 324). To determine the conversion response of the DUT, TM1 must have a reciprocal conversion response.

FIGS. 4, 5, and 6 depict examples of well-known three-port mixer FTDs that can be utilized as the test mixers in a three-pair measurement system. The mixers are passive diode-based mixers in which the mixer diode(s) 430, 530, and 630 is/are driven by the LO of the test system. The mixer of FIG. 4 is an example of a single diode mixer, the mixer of FIG. 5 is an example of a single balanced mixer, and the mixer of FIG. 6 is an example of a double balanced mixer (DBM). Typical solid state mixer diodes have a threshold voltage of 0.3 volts and are biased by an LO. FIG. 7 depicts the voltage modulation of an example LO, having an amplitude of 0.3 volts, that can be used to bias the mixers of FIGS. 4–6. The voltage modulation of the passive diode-based mixers causes the mixer diodes to be forward biased and reversed biased in an alternating fashion, thereby mixing an RF with the LO to generate an IF or mixing an IF with the LO to generate an RF.

Although the three-pair measurement system for characterizing an FTD requires at least one reciprocal FTD to provide quality measurement results, current passive diode-based mixers, such as the example mixers depicted in FIGS. 4–6, do not exhibit the required reciprocal conversion response. Typically, passive diode-based mixers exhibit greater conversion loss during down-conversion than during up-conversion. Clark discloses a calibration technique that involves adjusting multiple attenuators to reduce reflections and optimize conversion linearity as a way to ensure that at least one of the FTDs has a reciprocal conversion response. Many measurements of mixers show that linearity alone is insufficient to guarantee reciprocity, and reflections are irrelevant with respect to reciprocity.

In view of the need to characterize FTDs, especially three-port mixer FTDs and in view of the need to utilize an FTD with a reciprocal conversion response in a s three-pair measurement system and method, what is needed is a reciprocal FTD that can be incorporated into a three-pair measurement system and method.

SUMMARY OF THE INVENTION

A frequency translating device (FTD) includes at least one mixer diode connected to down-convert an RF to an IF and to up-convert an IF to an RF and a source of direct current (DC) bias that is electrically connected to the mixer diode. The source of DC bias provides a DC bias to the mixer diode that moves the voltage that is applied to the mixer diode closer to the threshold voltage of the mixer diode. The mixer diode is turned on in response to the DC bias and in response to an LO drive. Because a DC bias is applied to the mixer diode, the peak to peak voltage range of the LO drive that is needed to turn on the mixer diode can be reduced in comparison to the peak to peak voltage range that is required to turn on a mixer diode without the DC bias. Reducing the peak to peak voltage range of the LO drive that is applied to the mixer diode reduces the excitation of the parasitic voltage-dependent capacitance of the mixer diode, thereby causing the FTD to exhibit improved reciprocity when the FTD is used for down-conversion and up-conversion.

Because the peak to peak voltage range of the LO can be reduced, the LO drive can be supplied at an amplitude that is less than the threshold voltage of the mixer diode.

To produce the required mixing, the magnitude of the DC bias and the LO drive are such that the sum of the DC bias and the LO drive periodically turns on the mixer diode.

The FTD may include additional mixer diodes that are DC biased similar to the mixer diode described above.

A method for operating an FTD that includes at least one mixer diode involves down-converting an RF to an IF to obtain a down-conversion response, up-converting an IF to an RF to obtain an up-conversion response, controlling the excitation of the parasitic voltage-dependent capacitance of the mixer diode during the down-conversion and the up-conversion to make the down-conversion response reciprocal to the up-conversion response, and providing an LO drive to the one mixer diode. The voltage-dependent capacitance is controlled by providing a DC bias to the mixer diode that moves the voltage that is applied to the mixer diode closer to the threshold voltage of the mixer diode.

Another embodiment of the invention is a three-pair measurement system for determining the conversion response of a device under test (DUT), where the DUT is an FTD. The system includes an analyzer, a controller, and means for coupling the DUT to a first test FTD (TM1) during a first measurement, for coupling the DUT to a second test FTD (TM2) during a second measurement, and for coupling TM1 to TM2 during a third measurement, where both TM1 and TM2 are FTDs. The first measurement provides a first conversion response of the DUT coupled with TM1, with one of the coupled DUT and TM1 being an up-converter FTD and the other one of the coupled DUT and TM1 being a down-converter FTD. The second measurement provides a second conversion response of the DUT coupled to TM2, with one of the coupled DUT and TM2 being an up-converter FTD and the other one of the coupled DUT and TM2 being a down-converter FTD. The third measurement provides a third conversion response of TM1 coupled with TM2, with one of the coupled TM1 and TM2 being an up-converter FTD and the other one of the coupled TM1 and TM2 being a down-converter FTD.

One of the TM1 FTD and TM2 FTD has reciprocal up-conversion and down-conversion responses, where the reciprocal FTD is an up-converter during one of the first, second, or third measurements and is a down-converter during another one of the first, second, or third measurements. The reciprocal FTD includes at least one mixer diode connected to down-convert and to up-convert and means for controlling the parasitic voltage-dependent capacitance of the mixer diode to produce a reciprocal conversion response between the down-conversion and the up-conversion. The means for controlling the parasitic voltage-dependent capacitance of the mixer diode includes a source of DC bias that is electrically connected to the mixer diode. The source of DC bias provides a DC bias to the mixer diode that moves the voltage that is applied to the mixer diode closer to the threshold voltage of the mixer diode. The mixer diode is turned on in response to the DC bias and in response to an LO drive, wherein the peak to peak voltage range of the LO drive is less than the peak to peak voltage that would be required to turn on a mixer diode that is not DC biased. As with the FTD described above, reducing the peak to peak voltage of the LO drive that is applied to the mixer diode reduces the excitation of the parasitic voltage-dependent capacitance of the mixer diode, thereby causing the FTD to exhibit improved reciprocity when the FTD is used for down-conversion and up-conversion.

The analyzer of the measurement system obtains the first, second, and third measurements by providing an input signal at a first connection and by sampling an output signal at a second connection. The controller of the measurement system calculates the conversion response of the DUT from the first, second, and third conversion responses.

Because the peak to peak voltage range of the LO can be reduced, the LO drive can be supplied at an amplitude that is less than the threshold voltage of the mixer diode.

To produce the required mixing, the magnitude of the DC bias and the LO drive are such that the sum of the DC bias and the LO drive periodically turns on the mixer diode.

In an embodiment of the three-pair measurement system, the reciprocal FTD may include additional mixer diodes that are DC biased similar to the mixer diode described above.

The three-pair measurement system may include an LO source for providing the LO drive, wherein the up-conversion and down-conversion FTDs receive the LO drive for frequency translation. A further embodiment includes an attenuator located between the LO source and the reciprocal FTD to provide the reciprocal FTD with a reduced LO drive.

A method for determining the conversion response of a DUT, where the DUT is an FTP involves three measurements. The first measurement involves measuring a first conversion response of the DUT coupled with a first test device (TM1), where one of the coupled DUT and TM1 is an up-converter FTD and the other one of the coupled DUT and TM1 is a down-converter FTD. The second measurement involves measuring a second conversion response of the DUT coupled with a second test device (TM2), where one of the coupled DUT and TM2 is an up-converter FTD and the other one of the coupled DUT and TM2 is a down-converter FTD. The third measurement involves measuring a third conversion response of TM1 coupled with TM2, where one of the coupled TM1 and TM2 is an up-converter FTD and the other one of the coupled TM1 and TM2 is a down-converter FTD and where one of the TM1 FTD and TM2 FTD has reciprocal up-conversion and down-conversion responses. The reciprocal FTD is an up-converter during one of the first, second, or third measurements and is a down-converter during another one of the first, second, or third measurements. The reciprocal FTD includes at least one mixer diode, wherein operation of the reciprocal FTD includes controlling the excitation of the parasitic voltage-dependent capacitance of the mixer diode to make the down-conversion response reciprocal to the up-conversion response by providing a DC bias to the mixer diode that moves the voltage that is applied to the mixer diode closer to the threshold voltage of the mixer diode and providing an LO drive to the mixer diode. The conversion response of the DUT is calculated from the first, second, and third conversion responses.

Other aspects and advantages of the present invention will become apparent from the following detailed description, taken in conjunction with the accompanying drawings, illustrating by way of example the principles of the invention. Other embodiments of the invention may provide other advantages in addition to, or in lieu of, those discussed above.

DETAILED DESCRIPTION

Figure 8:
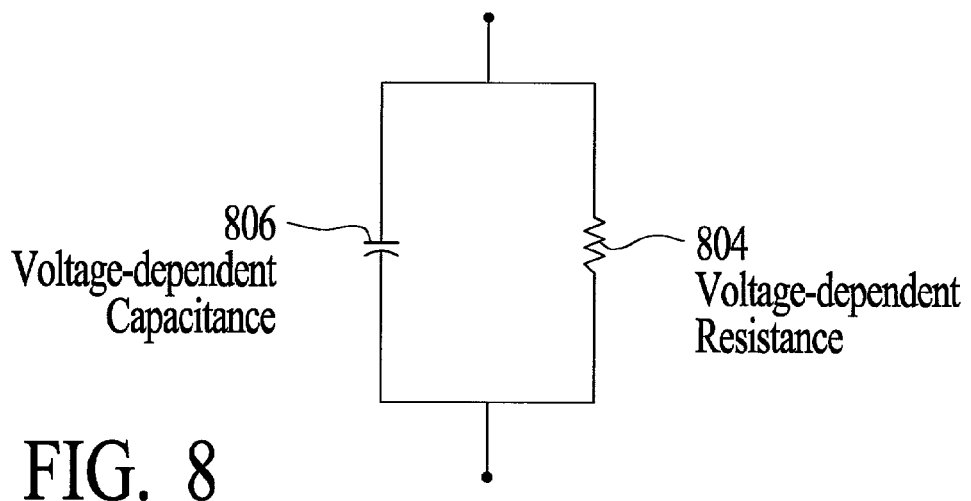
FIG. 8 depicts a diode model that includes voltage-dependent capacitance and voltage-dependent resistance.

As stated above, it is experimentally observed that passive diode-based mixers exhibit greater conversion loss during down-conversion than during up-conversion. The cause of this non-reciprocal behavior is a process known as parametric amplification enabled by the inherent voltage-dependent parasitic capacitance exhibited by all diodes. A diode can be modeled sufficiently for present purposes as a voltage dependent resistance 804 in parallel with a voltage-dependent capacitance 806, as shown in FIG. 8. The LO voltage that drives the resistive component of the diode to make the diode act as a switch is also available to drive the capacitive component. This causes pumping of charge through the capacitor, which is non-linear because of the voltage-dependence of the capacitance. The non-linear pumping results in parametric amplification, wherein power from the LO is converted to the output frequency. Parametric amplifiers always have gain when up-converting and loss when down-converting. Thus the parametric amplification causes destructive interference to the normal mixing process in down-converters, resulting in higher conversion loss. On the other hand, it causes constructive interference (i.e., enhancement) when up-converting, resulting in lower conversion loss.

As described above, reciprocal mixers are needed to make accurate conversion loss measurements of a DUT. Accurate conversion loss measurements require the elimination of parametric amplification that is caused by capacitive pumping by the LO. Therefore, the reciprocity of a mixer can be improved by decreasing capacitive pumping to negligible levels.

Most general-purpose mixers have enough parametric pumping to cause measurable non-reciprocity, however reciprocity is not a design requirement and therefore there is no reason to reduce the capacitive pumping. Furthermore, designing mixers for low pumping tends to degrade other performance numbers that are usually of interest.

Figure 6:
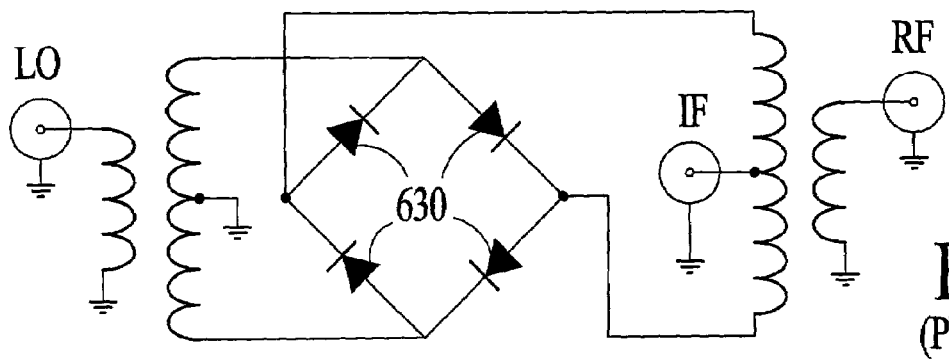
FIG. 6 is an example of a double balanced mixer.
Figure 7:
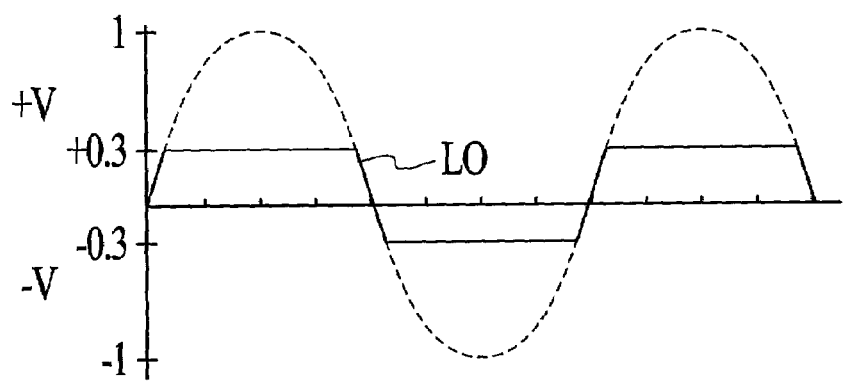
FIG. 7 depicts the voltage across one of the diodes in the mixer of FIGS. 4, 5, and 6 as a function of time.

The DBM mixer of FIG. 6 represents the vast majority of diode mixers currently in use. FIG. 7 depicts the typical voltage waveform across one of the diodes. The voltage is constrained to a peak to peak value approximately equal to twice the threshold voltage of the diode. In this embodiment, the diode is a Schottky diode, having a turn on voltage of 0.3V, resulting in a peak to peak voltage of 0.6V. In a mixer of the design of FIG. 6, the peak LO voltage will typically be limited to the turn on voltage (typically 0.3V for a Schottky diode), as shown in FIG. 7. Thus the total voltage range for the diode will be 0.6V. The capacitance changes substantially over this voltage range resulting in parametric amplification and non-reciprocal mixing.

In a typical DBM, the diodes are used as switches between 50 ohm ports. Two diodes are turned on simultaneously and, for the purposes of computing insertion loss, are effectively in parallel. Thus when the diodes have an AC impedance of 200 ohms each, the insertion resistance is 100 ohms. A 100 ohm resistance inserted in a 50 ohm system results in 6 dB of loss (i.e., the output voltage is half of the input voltage). The instantaneous LO voltage at the mixer diode(s) necessary to achieve 6 dB of insertion loss is referred to herein as the "threshold" voltage of the mixer diode(s). For typical Schottky diodes, the threshold voltage is 0.25V. The AC impedance of a diode follows an exponential law whereby it increases or decreases by a factor of 10 for each increase or decrease of 0.06 V in the diode voltage. Therefore, if the diode is biased at the threshold voltage by the DC bias, as used herein, a peak-to-peak LO voltage of 0.12 V will be sufficient to establish an AC impedance range of 100:1, which is sufficient contrast for good mixing. Thus, when the mixer diode(s) are turned "off", they provide high insertion loss (about 20 dB), and when the mixer diode(s) are turned "on", they provide low insertion loss (about 1 dB). The 5:1 (0.6V: 0.12V) reduction in LO voltage across the diode greatly reduces parametric pumping resulting in much better reciprocity.

Figure 4:
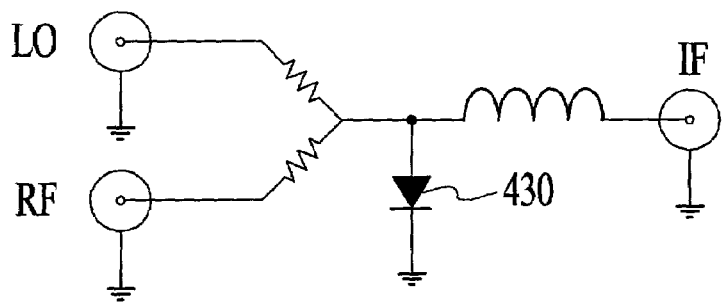
FIG. 4 is an example of a single diode mixer.
Figure 5:
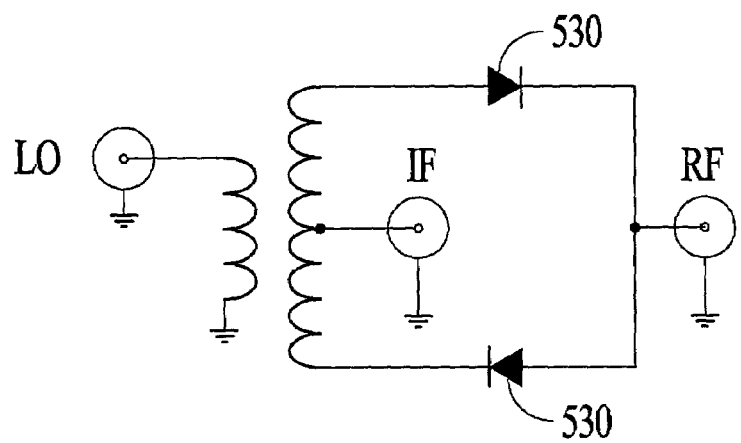
FIG. 5 is an example of a single balanced mixer.
Figure 9:
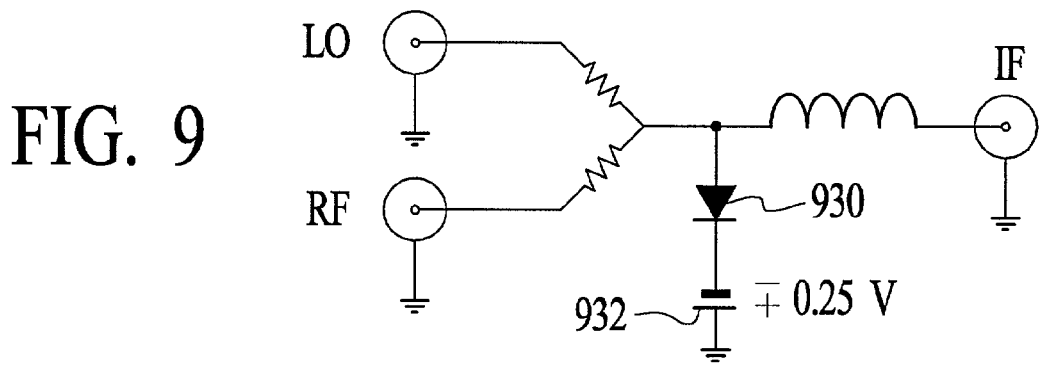
FIG. 9 is an example of a single diode mixer with DC bias added to the mixer diode in accordance with an embodiment of the invention.
Figure 10:
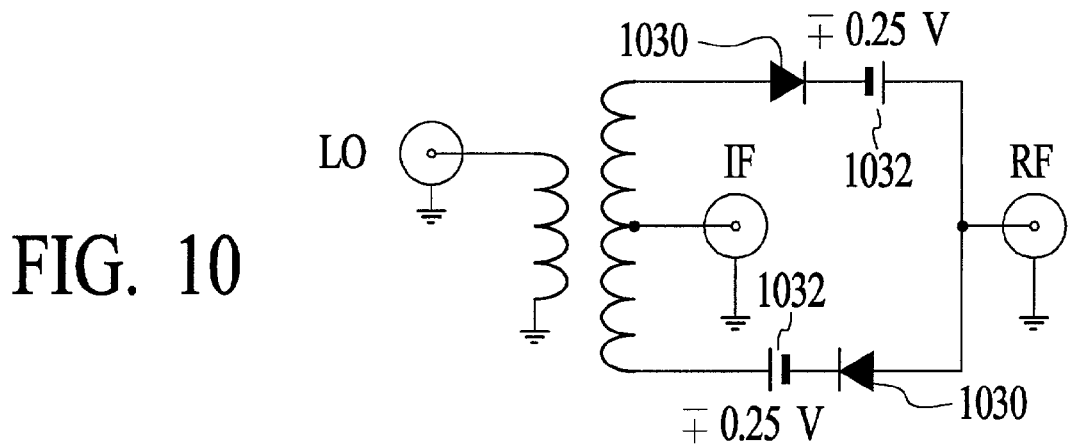
FIG. 10 is an example of a single balanced mixer with DC bias added to the mixer diode in accordance with an embodiment of the invention.
Figure 11:
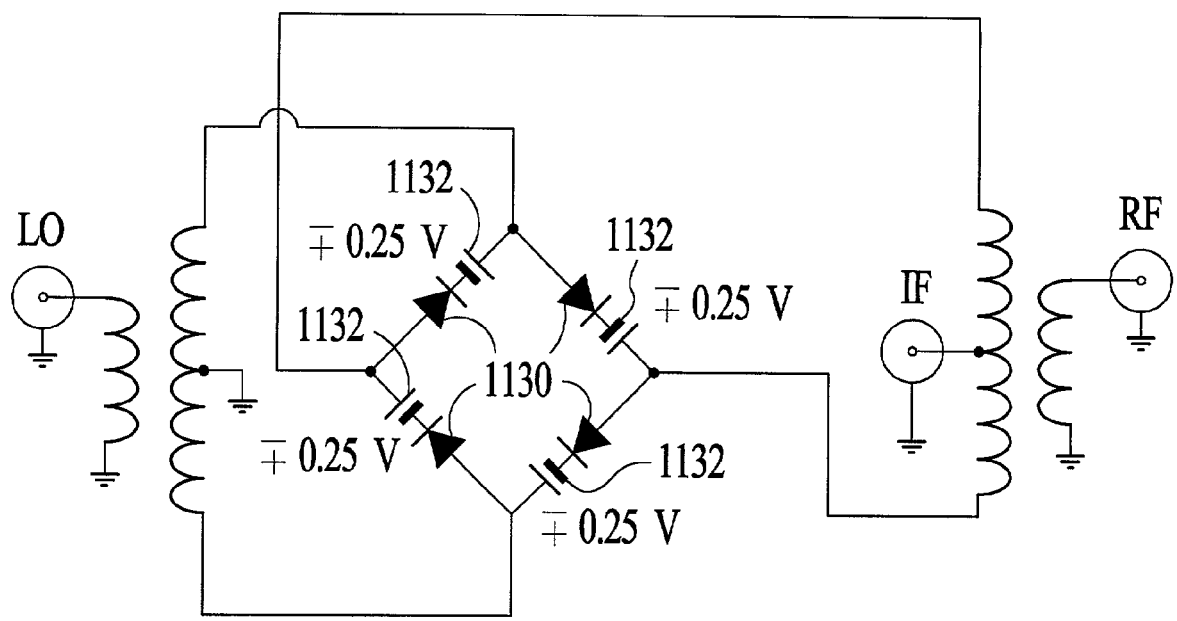
FIG. 11 is an example of a double balanced mixer with DC bias added to the mixer diode in accordance with an embodiment of the invention.

FIGS. 9–11 depict example embodiments of FTDs, that are similar to the well-known FTDs depicted in FIGS. 4–6, in which the excitation of the parasitic voltage-dependent capacitance of the mixer diode(s) 930, 1030, and 1130 is reduced by providing a DC bias to the mixer diode(s) that moves the voltage that is applied to the mixer diode(s) closer to the threshold voltage of the mixer diode(s). In an embodiment, a DC bias that is equal to the threshold voltage is applied to the mixer diode(s).

FIG. 9 depicts an embodiment of a single diode mixer, FIG. 10 depicts an embodiment of a single-balanced mixer, and FIG. 11 depicts an embodiment of a double balanced mixer. The example mixers each include DC bias sources 932, 1032, and 1132 that provide DC bias that moves the voltage that is applied to the mixer diode(s) closer to the threshold voltage of the mixer diode(s) 930, 1030, and 1130. For example, a DC bias of 0.25 volts is applied to the mixer diode(s). By providing a DC bias to the mixer diode(s), the peak to peak voltage range of the LO drive can be reduced. Reducing the peak to peak voltage of the LO drive that is applied to the mixer diode(s) reduces the excitation of the parasitic voltage-dependent capacitance of the mixer diode(s) and causes the FTD to have a more reciprocal conversion response.

Figure 12:
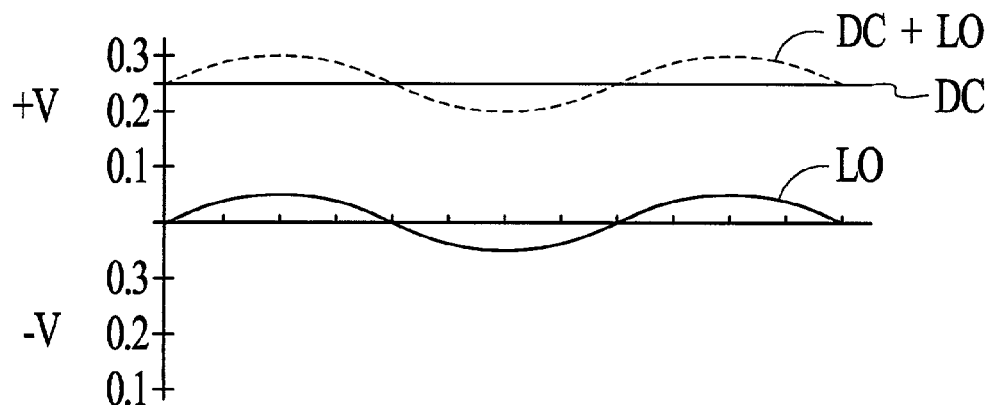
FIG. 12 depicts an example of the DC bias, the LO drive, and the combined DC bias and LO drive that is applied to the mixer diode(s) of FIGS. 9–11 in accordance with an embodiment of the invention.

FIG. 12 depicts an example of DC bias, LO drive, and the combined DC bias and LO drive that can be applied to the mixer diode(s) of FIGS. 9–11. In the example of FIG. 12, a mixer diode(s) is turned on each time the LO drive is near its peak.

Figure 13:
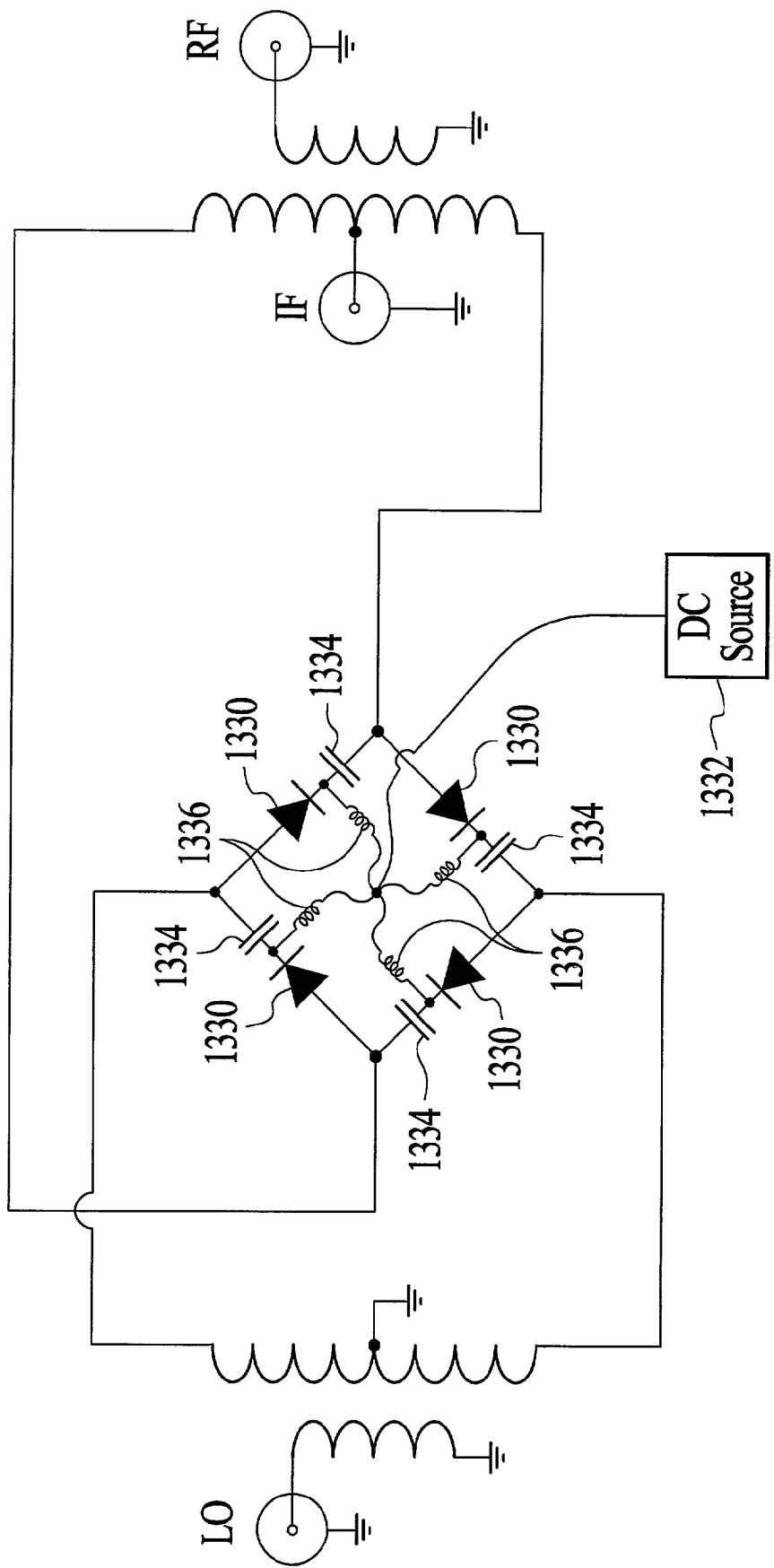
FIG. 13 depicts an embodiment of a double balanced mixer, similar to the double balanced mixer of FIG. 11, that includes a particular arrangement for providing DC bias to the four mixer diodes.

FIG. 13 depicts an embodiment of a double balanced mixer, similar to the double balanced mixer of FIG. 11, that includes a particular arrangement for providing DC bias to the four mixer diodes 1330. DC bias is added to the four mixer diodes by locating a capacitor 1334 on the cathode side of each diode and by connecting an inductor 1336 in parallel between each capacitor and diode pair. The four inductors are then coupled together and connected to a DC source 1332.

Figure 14:
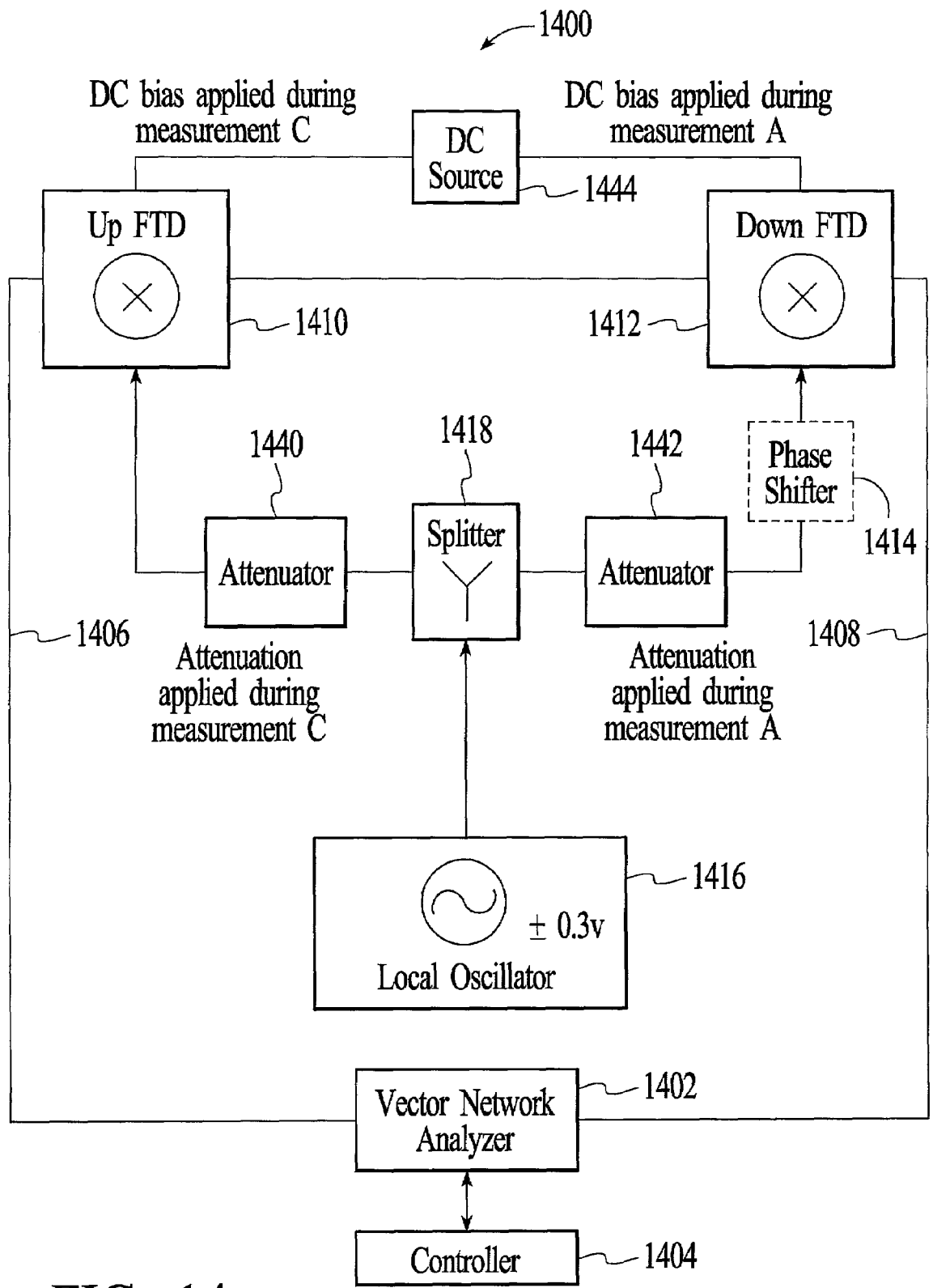
FIG. 14 depicts an embodiment of a three-pair measurement system that is configured to add a DC bias to the reciprocal FTD and to provide a reduced LO drive to the reciprocal FTD.

FIG. 14 depicts an embodiment of a three-pair measurement system 1400 that is configured to add a DC bias to the reciprocal FTD and to provide a reduced LO drive to the reciprocal FTD. The three-pair measurement system can be used in conjunction with the mixers described in FIGS. 9–11 and 13. The three-pair measurement system includes a VNA 1402, a controller 1404, an up-conversion FTD 1410, a down-conversion FTD 1412, connections 1406 and 1408 between the VNA and the up-conversion and down-conversion FTDs, an optional phase shifter 1414, an LO 1416, a splitter 1418, an up-conversion FTD attenuator 1440, a down-conversion FTD attenuator 1442, and a DC source 1444. The three-pair measurement system is similar to the three-pair measurement system disclosed by Clark in U.S. Pat. No. 5,937,006, which is incorporated by reference herein, except that the three-pair measurement system of FIG. 14 includes the ability to add DC bias to the reciprocal FTD and to reduce the amplitude of LO bias that is applied to the reciprocal FTD.

Figure 1:
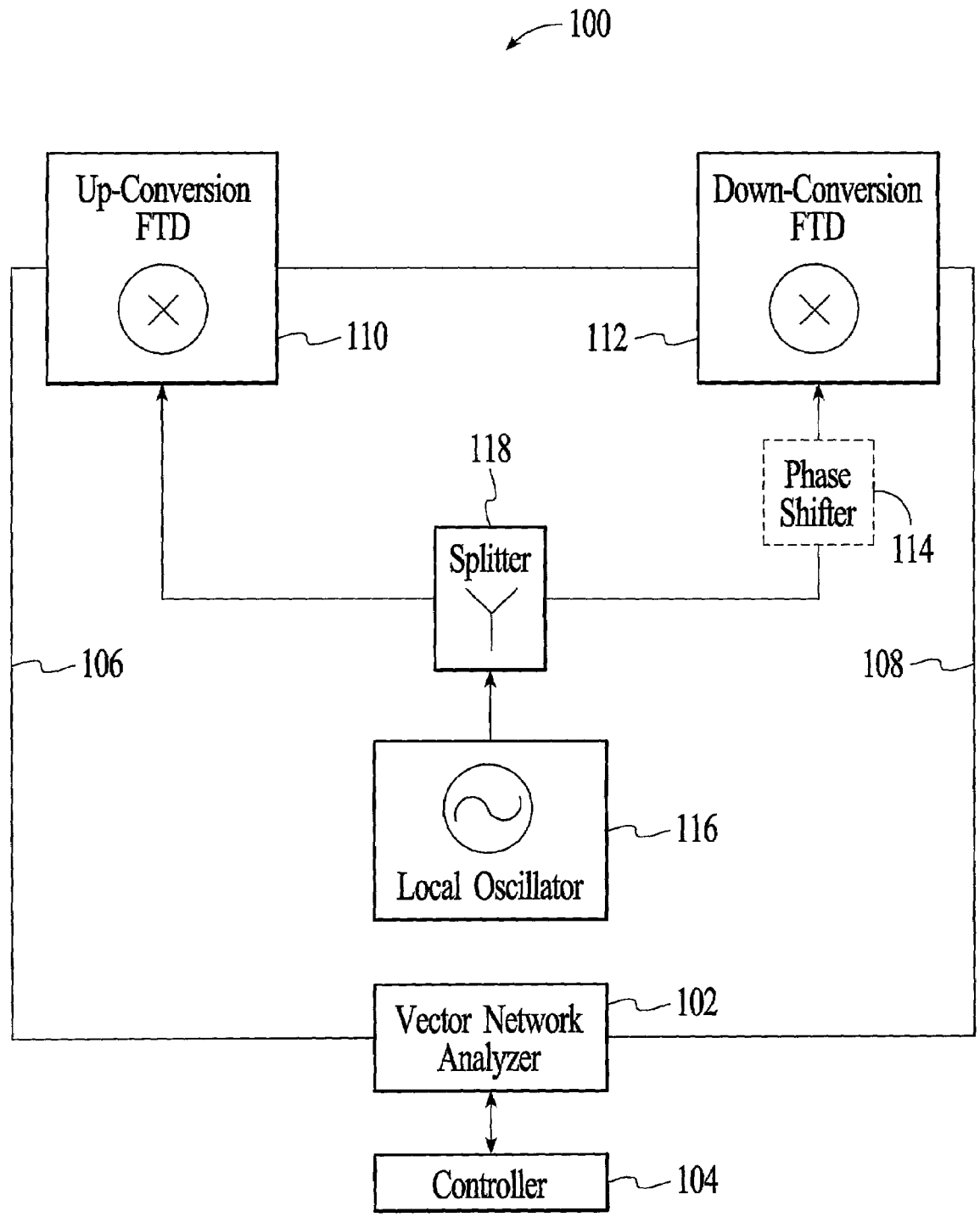
FIG. 1 depicts the basic structure of a prior art three-pair measurement system for characterizing the single side band conversion response of an FTD.

In the embodiment of FIG. 14, the DC source 1444 is connected to supply DC bias to the up-conversion FTD 1410 and to the down-conversion FTD 1412. In an embodiment, the DC source supplies approximately 0.25 volt of DC bias to the mixer diode(s) as described with reference to FIGS. 9–13. The attenuators 1440 and 1442 are located between the splitter 1418 and the respective up-conversion FTD 1410 and down-conversion FTD 1412 to selectively reduce the amplitude of the LO that is supplied to the respective reciprocal FTD from the LO. In an embodiment, the attenuators can attenuate the LO drive from 0.3 volts down to 0.05 volts. In an embodiment, the attenuators are adjustable over a range of zero attenuation to the desired attenuation level. In another embodiment, the attenuators can be by-passed and in another embodiment the attenuators are added and removed as needed between the different measurements. In an embodiment, the DC bias supplied by the DC source is in the range of 0.1–0.25 volts and the maximum amplitude of the LO drive is in the range of 0.05–0.2 volts peak. As with the test system of FIG. 1, the connections 1406 and 1408 couple the FTDs to the VNA and may include ports and connection cables as is known in the field.

Figure 2:
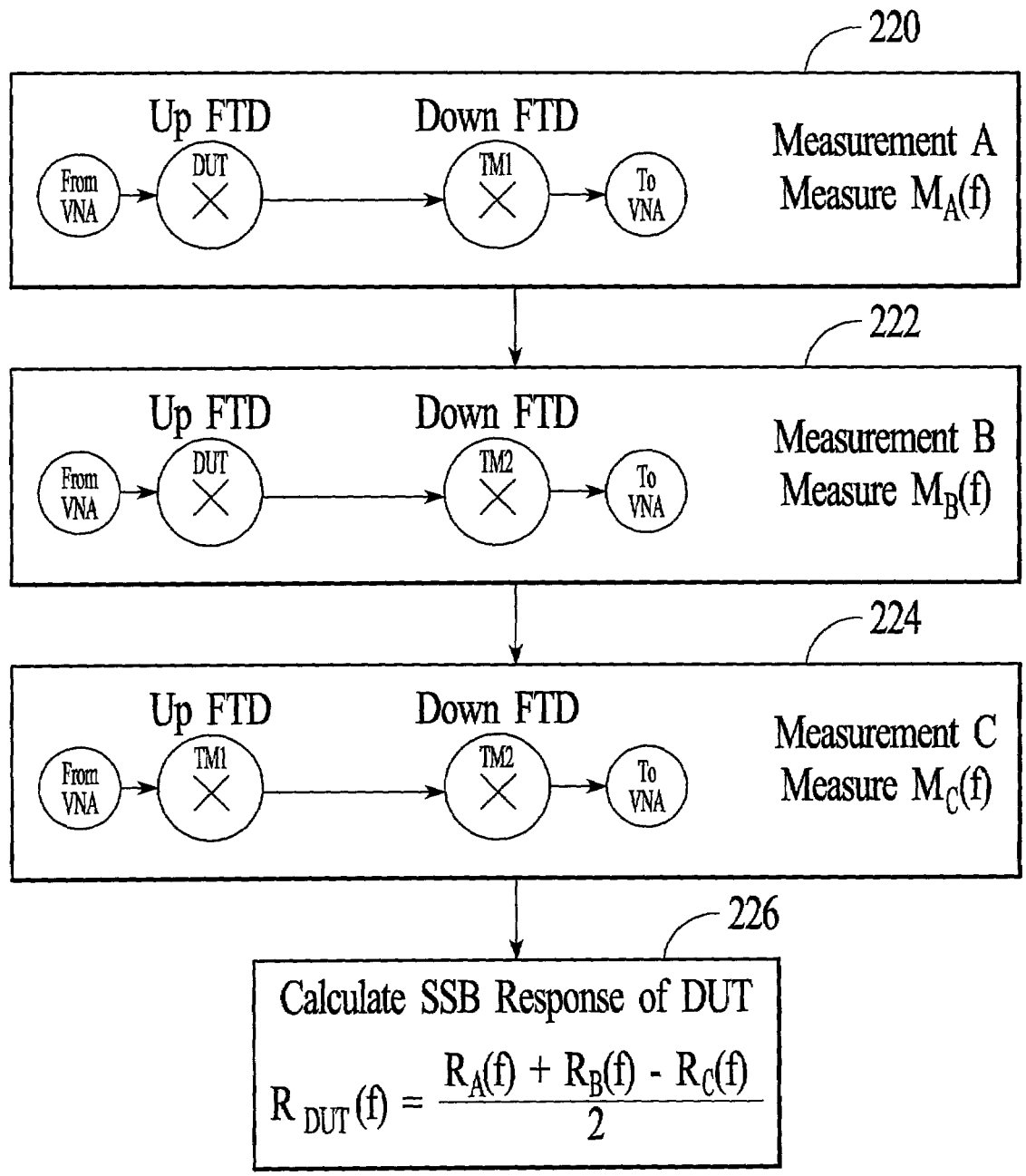
FIG. 2 is a measurement flow diagram for characterizing a single side band conversion response that indicates the different combinations of a DUT, TM1, and TM2 that are used to characterize the DUT.

When characterizing the single side band conversion response of a DUT, the measurement approach described with reference to FIG. 2 is followed using the three-pair measurement system 1400 of FIG. 14 with the below-described modifications. Referring back to FIG. 2, during measurement A (step 220), DC bias is applied to the mixer diode(s) of the reciprocal FTD (TM1) which is located in the down-conversion FTD 1412 position. In an embodiment, during measurement A, the LO drive applied to the down-conversion FTD is reduced by the down-conversion attenuator 1442 to a point where the combination of the DC bias and the LO drive periodically activates the mixer diode(s) of TM1. The DC bias and lowered LO drive are provided to ensure that TM1 exhibits a reciprocal conversion response when being used as the down-conversion FTD and as the up-conversion FTD 1410. During measurement A, no DC bias is applied to the up-conversion FTD (the DUT) and the LO is not attenuated before being inserted into the up-conversion FTD.

During measurement B (step 222), no DC bias is applied to the FTDs 1410 and 1412 and the LO is not attenuated before being inserted into the FTDs because the reciprocal FTD (TM1) is not used during measurement B. As shown in FIG. 2, the DUT is used as the up-conversion FTD and TM2 is used as the down-conversion FTD.

During measurement C (step 224), DC bias is applied to the mixer diode(s) of the reciprocal FTD (TM1) which is located in the up-conversion FTD 1410 position. If the LO drive is reduced during measurement A, then during measurement C, the LO drive applied to the up-conversion FTD is reduced by the up-conversion attenuator 1440 to a point where the combination of the DC bias and the LO drive periodically activates the mixer diode(s) of TM1. In an embodiment, the same levels of DC bias and LO drive are supplied to TM1 in steps A and C. The DC bias and lowered LO drive are provided to ensure that TM1 exhibits a reciprocal conversion response when being used as the up-conversion FTD and as the down-conversion FTD 1412. During measurement C, no DC bias is applied to the down-conversion FTD (TM2) and the LO drive is not attenuated before being inserted into the down-conversion FTD. In an embodiment, the single side band response of the DUT is calculated as shown in step 226 of FIG. 2, where $R_{DUT}(f)=[R_A(f)+R_B(f)-R_C(f)]/2$.

In the embodiment of FIG. 14, the measurements A, B, and C are all made by the VNA 1402 and the response calculations are made by the controller 1404. A description of the response calculations is found in Clark.

Although the three-pair measurement technique described above involves adding DC bias and reducing the amplitude of the LO drive, alternative embodiments of the three-pair measurement technique may include adding DC bias without reducing the amplitude of the LO drive.

Figure 3:
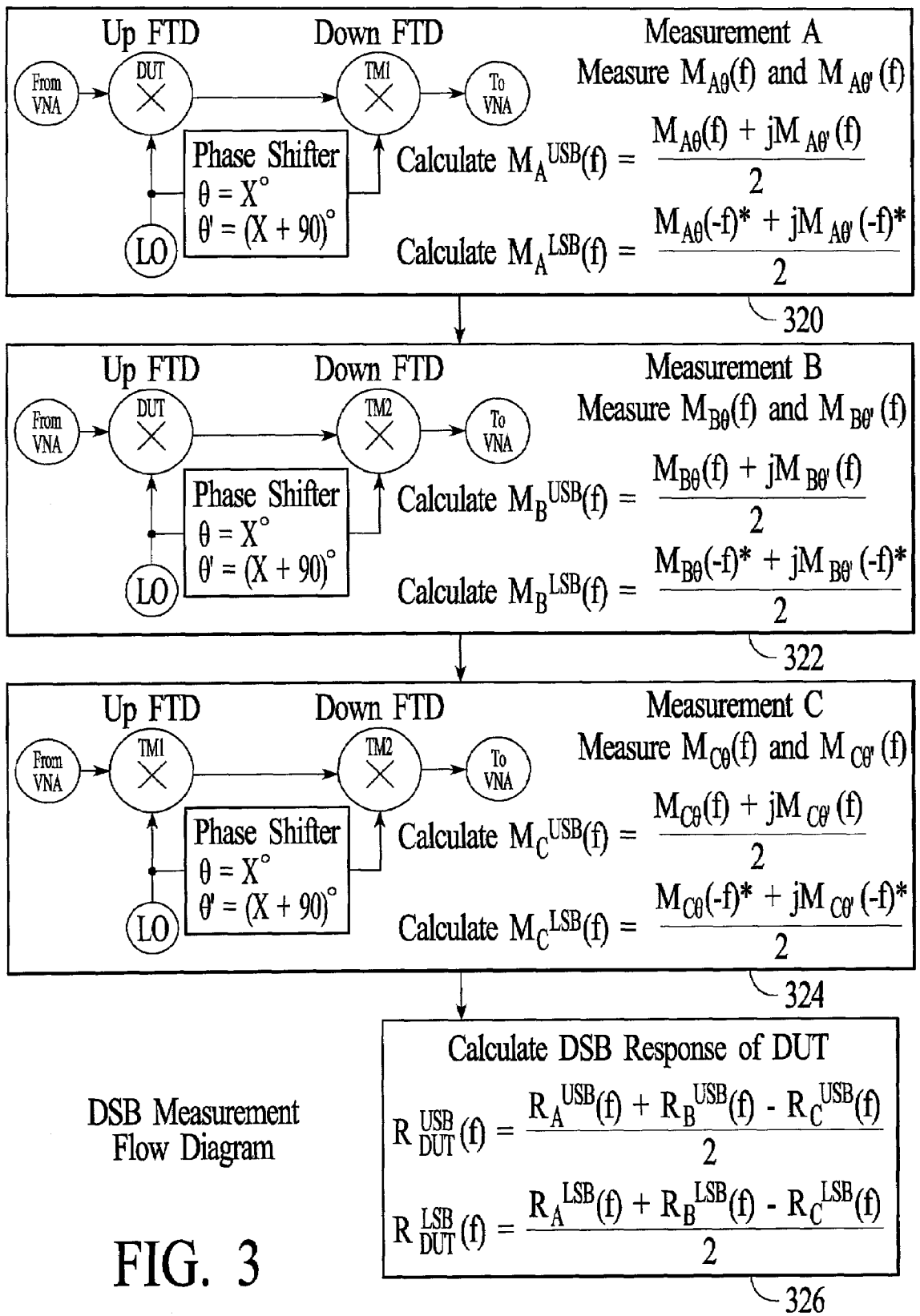
FIG. 3 is a measurement flow diagram for characterizing a double side band response that indicates the different combinations of a DUT, TM1, TM2, and the phase of the LO that are used to characterize the DUT.

The three-pair measurement system 1400 of FIG. 14 can also be used to characterize the double side band conversion response of a DUT by utilizing the phase shifter 1414 to shift the phase of the LO bias as described with reference to FIG. 3. Referring back to FIG. 3, during measurements A and A' (step 320), DC bias is applied to the mixer diode(s) of the reciprocal FTD (TM1) which is located in the down-conversion FTD 1412 position. In an embodiment, during measurements A and A', the LO drive applied to the down-conversion FTD is reduced by the down-conversion attenuator 1442 to a point where the combination of the DC bias and the LO drive periodically activates the mixer diode(s) of TM1. The DC bias and lowered LO drive are provided to ensure that TM1 exhibits a reciprocal conversion response when being used as the down-conversion FTD and as the up-conversion FTD 1410. During measurements A and A', no DC bias is applied to the up-conversion FTD (the DUT) and the LO is not attenuated before being inserted into the up-conversion FTD.

During measurements B and B' (step 322), no DC bias is applied to the FTDs 1410 and 1412 and the LO is not attenuated before being inserted into the FTDs because the reciprocal FTD (TM1) is not used during measurements B and B'. As shown in FIG. 2, the DUT is used as the up-conversion FTD and TM2 is used as the down-conversion FTD.

During measurements C and C' (step 324), DC bias is applied to the mixer diode(s) of the reciprocal FTD (TM1) which is located in the up-conversion FTD 1410 position. If the LO drive is reduced during measurements A and A', then during measurements C and C', the LO drive applied to the up-conversion FTD is reduced by the up-conversion attenuator 1440 to a point where the combination of the DC bias and the LO drive periodically activate the mixer diode(s) of TM1. In an embodiment, the same levels of DC bias and LO drive are supplied to TM1 in steps A, A', C, and C'. The DC bias and lowered LO drive are provided to ensure that TM1 exhibits a reciprocal conversion response when being used as the up-conversion FTD and as the down-conversion FTD 1412. During measurements C and C', no DC bias is applied to the down-conversion FTD (TM2) and the LO drive is not attenuated before being inserted into the down-conversion FTD. In an embodiment, the double side band response of the DUT is calculated as shown in step 326 of FIG. 3, where the USB conversion response of the DUT is calculated as $R_{DUT\ USB}(f)=[R_{A\ USB}(f)+R_{B\ USB}(f)-R_{C\ USB}(f)]/2$ and the LSB conversion response of the DUT is calculated as $R_{DUT\ LSB}(f)=[R_{A\ LSB}(f)+R_{B\ LSB}(f)-R_{C\ LSB}(f)]/2$.

Although the three-pair measurement technique described above involves adding DC bias and reducing the amplitude of the LO drive, alternative embodiments of the three-pair measurement technique may include adding DC bias without reducing the amplitude of the LO drive.

Although the conversion response of a DUT can be characterized by applying DC bias only to the reciprocal FTD and by reducing the LO drive amplitude only for the reciprocal FTD, other techniques for characterizing the conversion response of a DUT may involve providing DC bias and reducing the LO drive to both the up-conversion and down-conversion FTDs simultaneously. For example, a DC bias of 0.25 volts can be simultaneously applied to the mixer diode(s) of the up-conversion and down-conversion FTDs 1410 and 1412 while an LO drive of 0.05 volts is simultaneously applied to the mixer diode(s) of the up-conversion and down-conversion FTDs from the LO source 1416. In this embodiment, the output of the LO source can be attenuated to the desired reduced LO drive or the LO source can be selected to have the desired LO drive without attenuation.

Although specific embodiments of the invention have been described and illustrated, the invention is not limited to the specific forms and arrangements of parts so described and illustrated. The invention is limited only by the claims.

What is claimed is:

1. A frequency translating device (FTD) that utilizes a local oscillator (LO) to convert a radio frequency (RF) to an intermediate frequency (IF) and to convert an IF to a RF, said FTD comprising:

at least one mixer diode connected to down-convert an RF to an IF and to up-convert an IF to an RF, said mixer diode having a threshold voltage; and means for controlling the excitation of the parasitic voltage-dependent capacitance of said at least one mixer diode to produce a reciprocal conversion response between said down-conversion and said up-conversion, said means for controlling the excitation of the parasitic voltage-dependent capacitance of said at least one mixer diode including at least one source of direct current (DC) bias that is electrically connected to said at least one mixer diode, each of said at least one source of DC bias corresponding to one of each of said at least one mixer diode, said at least one source of DC bias providing a DC bias to said at least one mixer diode that moves the voltage that is applied to said at least one mixer diode closer to said threshold voltage of said at least one mixer diode;

said at least one mixer diode being turned on in response to said DC bias and in response to an LO drive.

2. The FTD of claim 1 wherein said LO drive has an amplitude that is less than said threshold voltage of said at least one mixer diode.

3. The FTD of claim 1 wherein the sum of said DC bias and said LO drive periodically turns on said at least one mixer diode.

4. The FTD of claim 1 further including a second mixer diode connected to down-convert an RF to an IF and to up-convert an IF to an RF, said second mixer diode having a threshold voltage and including means for controlling the excitation of the parasitic voltage-dependent capacitance of said second mixer diode to produce a reciprocal conversion response between said down-conversion and said up-conversion, said means for controlling the excitation of the parasitic voltage-dependent capacitance of said second mixer diode including a second source of direct current (DC) bias that is electrically connected to said second mixer diode, said second source of DC bias providing a DC bias to said second mixer diode that moves the voltage that is applied to said second mixer diode closer to said threshold voltage of said second mixer diode, said second mixer diode being turned on in response to said DC bias and in response to said LO drive that is used to turn on said at least one mixer diode.

5. The FTD of claim 1 further including second, third, and fourth mixer diodes connected to down-convert an RF to an IF and to up-convert an IF to an RF, said second, third, and fourth mixer diodes having threshold voltages and including means for controlling the excitation of the parasitic voltage-dependent capacitance of said second, third, and fourth mixer diodes to produce a reciprocal conversion response between said down-conversion and said up-conversion, said means for controlling the excitation of the parasitic voltage-dependent capacitance including second, third, and fourth direct current (DC) bias sources that are electrically connected to said second, third, and fourth mixer diodes, said second, third, and fourth DC bias sources providing DC bias to said second, third, and fourth mixer diodes that moves the voltage that is applied to said second, third, and fourth mixer diodes closer to said threshold voltage of said second, third, and fourth mixer diodes, said second, third, and fourth mixer diodes being turned on in response to said DC bias and in response to said LO drive that is used to turn on said at least one mixer diode.

6. A method for operating a frequency translating device (FTD) that includes at least one mixer diode, said at least one mixer diode having a threshold voltage, said method comprising:

down-converting a radio frequency (RF) to an intermediate frequency (IF), said down-conversion having a down-conversion response;

up-converting an IF to an RF, said up-conversion having an up-conversion response;

controlling the excitation of the parasitic voltage-dependent capacitance of said at least one mixer diode during said down-conversion and said up-conversion to make said down-conversion response reciprocal to said up-conversion response by providing a direct current (DC) bias to a DC source at each of said at least one mixer diode that moves the voltage that is applied to said at least one mixer diode closer to said threshold voltage of said at least one mixer diode; and providing a local oscillator (LO) drive to said at least one mixer diode.

7. The method of claim 6 wherein said LO drive has an amplitude that is less than the threshold voltage of said at least one mixer diode.

8. The method of claim 6 wherein the sum of said DC bias and said LO drive periodically turns on said at least one mixer diode.

9. The method of claim 6 wherein said FTD is used for down-conversion and up-conversion in a three-pair measurement method, where the three pairs of FTDs are chosen from a group of three FTDs.

10. The method of claim 6 wherein said DC bias is in the range of 0.1–0.25 volts and said LO drive has a peak to peak maximum amplitude in the range of 0.05–0.2 volts.

11. A system for determining the conversion response of a device under test (DUT), the DUT is a frequency translation device (FTD), the system comprising:

means for coupling the DUT to a first test FTD (TM1) during a first measurement, for coupling said DUT to a second test FTD (TM2) during a second measurement, and for coupling said TM1 to said TM2 during a third measurement, said TM1 and TM2 are FTDs, said first measurement provides a first conversion response of said DUT coupled with said TM1 with one of the coupled DUT and TM1 being an up-converter FTD and the other one of said coupled DUT and TM1 being a down-convener FTD, said second measurement provides a second conversion response of said DUT coupled to said TM2 with one of said coupled DUT and TM2 being an up-convener FTD and the other one of said coupled DUT and TM2 being a down-converter FTD, the third measurement provides a third conversion response of said TM1 coupled with said TM2 with one of said coupled TM1 and TM2 being an up-converter FTD and the other one of said coupled TM1 and TM2 being a down-converter FTD, one of said TM1 FTD and TM2 FTD has reciprocal up-conversion and down-conversion responses, said reciprocal FTD is an up-converter during one of said first, second, or third measurements and is a down-converter during another one of said first, second, or third measurements, said reciprocal FTD including:

at least one mixer diode connected to down-convert and to up-convert, said mixer diode having a threshold voltage;

means for controlling the excitation of the parasitic voltage-dependent capacitance of said at least one mixer diode to produce said reciprocal conversion response between said down-conversion and said up-conversion, said means for controlling the excitation of the parasitic voltage-dependent capacitance of said at least one mixer diode including at least one source of direct current (DC) bias that is electrically connected to said at least one mixer diode, each of said at least one source of DC bias corresponding to one of each of said at least one mixer diode, said at least one source of DC bias providing a DC bias to said at least one mixer diode that moves the voltage that is applied to said at least one mixer diode closer to said threshold voltage of said at least one mixer diode;

said at least one mixer diode being turned on in response to said DC bias and in response to a local oscillator (LO) drive;

an analyzer for measuring said first, second, and third measurements by providing an input signal at a first connection and by sampling an output signal from a second connection; and a controller for calculating the conversion response of said DUT from said first, second, and third conversion responses.

12. The system of claim 11 wherein said LO drive has an amplitude that is less than said threshold voltage of said at least one mixer diode.

13. The system of claim 11 further including an LO source for providing said LO drive, wherein said up-conversion and down-conversion FTDs receive said LO drive for frequency translation.

14. The system of claim 13 further including an attenuator located between said LO source and said reciprocal FTD.

15. The system of claim 11 wherein the sum of said DC bias and said LO drive periodically turns on said at least one mixer diode.

16. The system of claim 11 wherein said reciprocal FTD further includes a second mixer diode connected to down-convert an RF to an IF and to up-convert an IF to an RF, said second mixer diode having a threshold voltage and including means for controlling the excitation of the parasitic voltage-dependent capacitance of said second mixer diode to produce a reciprocal conversion response between said down-conversion and said up-conversion, said means for controlling the excitation of the parasitic voltage-dependent capacitance of said second mixer diode including a second source of direct current (DC) bias that is electrically connected to said second mixer diode, said second source of DC bias providing a DC bias to said second mixer diode that moves the voltage that is applied to said second mixer diode closer to said threshold voltage of said second mixer diode, said second mixer diode being turned on in response to said DC bias and in response to said LO drive that is used to turn on said at least one mixer diode.

17. The system of claim 11 wherein said reciprocal FTD further includes second, third, and fourth mixer diodes connected to down-convert an RF to an IF and to up-convert an IF to an RF, said second, third, and fourth mixer diodes having threshold voltages and including means for controlling the excitation of the parasitic voltage-dependent capacitance of said second, third, and fourth mixer diodes to produce a reciprocal conversion response between said down-conversion and said up-conversion, said means for controlling the excitation of the parasitic voltage-dependent capacitance including second, third, and fourth direct current (DC) bias sources that are electrically connected to said second, third, and fourth mixer diodes, said second, third, and fourth DC bias sources providing DC bias to said second, third, and fourth mixer diodes that moves the voltage that is applied to said second, third, and fourth mixer diodes closer to said threshold voltage of said second, third, and fourth mixer diodes, said second, third, and fourth mixer diodes being turned on in response to said DC bias and in response to said LO drive that is used to turn on said at least one mixer diode.

18. The system of claim 11 wherein said analyzer includes means for measuring said first, second, and third conversion responses by providing an input signal at said first connection and by sampling the output signal at said second connection, for repeating said first measurement with said LO drive of one of said up or down converters phase shifted ninety degrees to provide a first repeated conversion response, for repeating said second measurement with said LO drive of one of the up or down converters phase shifted ninety degrees to provide a second repeated conversion response, and for repeating said third measurement with said LO drive of one of said up or down converters phase shifted ninety degrees to provide a third repeated conversion response, said reciprocal FTD is an up-converter during one of said first, second, or third measurements and respectively during said first, second, or third repeated measurements and is a down-converter during another one of said first, second, or third measurements and respectively during said first, second, or third repeated measurements; and wherein said controller includes means for calculating the conversion response of said DUT from said first, second, and third conversion responses and said first, second, and third repeated conversion responses.

19. A method for determining the conversion response of a device under test (DUT), the DUT is a frequency translation device (FTD), the method comprising:

measuring a first conversion response of said DUT coupled with a first test device (TM1), said TM1 is an FTD, one of said coupled DUT and TM1 is an up-converter FTD and the other one of said coupled DUT and TM1 is a down-converter FTD;

measuring a second conversion response of said DUT coupled with a second test device (TM2), said TM2 is an FTD, one of said coupled DUT and TM2 is an up-converter FTD and the other one of said coupled DUT and TM2 is a down-converter FTD;

measuring a third conversion response of said TM1 coupled with said TM2, one of said coupled TM1 and TM2 is an up-converter FTD and the other one of said coupled TM1 and TM2 is a down-converter FTD, one of said TM1 FTD and TM2 FTD has reciprocal up-conversion and down-conversion responses, said reciprocal FTD is an up-converter during one of said first, second, or third measurements and is a down-converter during another one of said first, second, or third measurements, said reciprocal FTD including at least one mixer diode and at least one source of direct current (DC) bias, each of said at least one source of DC bias corresponding to one of each of said at least one mixer diode, wherein the operation of said reciprocal FTD includes:

controlling the excitation of the parasitic voltage-dependent capacitance of said at least one mixer diode to make said down-conversion response reciprocal to said up-conversion response by providing a direct current (DC) bias to said at least one mixer diode that moves the voltage that is applied to said at least one mixer diode closer to said threshold voltage of said at least one mixer diode;

providing a local oscillator (LO) drive to said at least one mixer diode; and calculating the conversion response of said DUT from said first, second, and third conversion responses.

20. The method of claim 19 wherein said LO drive has an amplitude that is less than the threshold voltage of said at least one mixer diode.

21. The method of claim 19 wherein the sum of said DC bias and said LO drive periodically turns on said at least one mixer diode.

22. The method of claim 19 wherein said DC bias is in the range of 0.1–0.25 volts and said LO drive has a peak to peak maximum amplitude in the range of 0.05–0.2 volts.

23. The method of claim 19 further including attenuating said LO drive before said LO drive is provided to said at least one mixer diode.

24. The method of claim 19 comprising:
   repeating said first measurement with said LO drive of one of said up or down converters phase shifted ninety degrees to provide a first repeated conversion response;
   repeating said second measurement with said LO drive of one of said up or down converters phase shifted ninety degrees to provide a second repeated conversion response;
   repeating said third measurement with said LO drive of one of said up or down converters phase shifted ninety degrees to provide a third repeated conversion response, said reciprocal FTD is an up-converter during one of said first, second, or third measurements and respective first, second, or third repeated measurements and is a down-converter during another one of said first, second, or third measurements and respective first, second, or third repeated measurements; and
   calculating the conversion response of said DUT from said first, second, and third conversion responses and said first, second, and third repeated conversion responses.

25. The FTD of claim 1, wherein each of said at least one source of DC bias comprises a capacitor and an inductor, said capacitor coupled to the cathode of said at least one mixer diode, said inductor coupled in parallel between said capacitor and said at least one mixer diode, said inductor also coupled to a DC source.

26. The system of claim 11, wherein each of said at least one source of DC bias comprises a capacitor and an inductor, said capacitor coupled to the cathode of said at least one mixer diode, said inductor coupled in parallel between said capacitor and said at least one mixer diode, said inductor also coupled to a DC source.

* * * * *